United States Patent [19]
Ryum et al.

[11] Patent Number: 5,981,345
[45] Date of Patent: Nov. 9, 1999

[54] SI/SIGE MOSFET AND METHOD FOR FABRICATING THE SAME

[75] Inventors: Byung-Ryul Ryum; Soo-Min Lee; Deok-Ho Cho; Tae-Hyeon Han, all of Daejeon, Rep. of Korea

[73] Assignee: Electronics and Telecommunications Research Institute, Daejeon, Rep. of Korea

[21] Appl. No.: 08/891,013

[22] Filed: Jul. 10, 1997

[30] Foreign Application Priority Data

Dec. 14, 1996 [KR] Rep. of Korea ............... 96 65726

[51] Int. Cl.⁶ .................................. H01L 21/249
[52] U.S. Cl. .............................. 438/303; 438/305
[58] Field of Search .................. 257/345, 347, 257/349, 350, 616; 438/297, 298, 300, 291, 302, 305, 451, 303

[56] References Cited

U.S. PATENT DOCUMENTS 5,360,749   11/1994   Anjum et al. ................ 438/297
5,760,442   6/1998    Shigyo et al. ................ 257/347

*Primary Examiner*—Olik Chaudhuri
*Assistant Examiner*—William David Coleman
*Attorney, Agent, or Firm*—Jacobson, Price, Holman & Stern, PLLC

[57] ABSTRACT

The present invention relates to a metal silicon field effect transistor (MOSFET), and more particularly to a MOSFET, using a Si or SiGe channel to effectively adjust threshold voltage. The transistor according to the present invention can solve the problems, such as the punch-through caused by the short distance between the source region and the drain region, the decrease of the breakdown voltage between the source region and the drain region and the leakage current flowing into the bulk region beneath the channel due to the drain-induced barrier lowering. Furthermore, because the source region and the drain region are isolated from the semiconductor substrate by the lower insulation layer, the removal of the parasite junction capacitor speed up the transistor.

12 Claims, 4 Drawing Sheets

SI/SIGE MOSFET AND METHOD FOR FABRICATING THE SAME

BACKGROUND OF THE INVENTION

1. Field of the Invention

The present invention relates to a metal oxide silicon field effect transistor (MOSFET), and more particularly to a MOSFET, using a Si or SiGe channel layer to effectively adjust threshold voltage, to improve the uniformity of threshold voltage, to prevent the electric characteristics of the device, such as the breakdown voltage, the punch-through effect and the drain-induced barrier lowering (DIBL), from being deteriorated by isolating source/drain regions.

2. Description of Prior Art

In general, the source/drain regions and the channel of the MOSFET are formed on a semiconductor substrate or a silicon-on-insulator (SOI) substrate using the ion implantation process. To use the MOSFET at high frequency, its channel length must be short. However, in the case where the channel length is short, the source/drain breakdown voltage is inevitably decreased and the drain-induced barrier lowering and the punch-through effects are caused to deteriorate the device. Furthermore, there exist the trade-off problem between high frequency and high breakdown voltage.

FIG. 1 is a cross sectional view illustrating a MOSFET in accordance with the first embodiment of a prior art.

As shown in FIG. 1, an active region is defined by forming a field oxide layer 2 by applying the thermal oxidation process to a semiconductor substrate 1, such as a silicon substrate. A channel region 12 is formed by implanting ions into the active region so as to adjust the threshold voltage. A gate electrode 4 is formed on the channel region 12 and a gate oxide layer is formed between the gate electrode 14 and the channel region 12. The low concentration ion implantation process is carried out so that lightly doped regions 5 are formed on the sidewalls of the gate electrode 4. Also, after forming the spacer oxide layer 6 on the both sidewalls of the gate electrode 4, a highly doped region 7 is formed in the semiconductor substrate 1 and both sides of the gate electrode, using the high concentration ion implantation process. Accordingly, the LDD structures, which includes the lighting doped region 5 and highly doped region 7, are formed both sides of the gate electrode 4, respectively. For example, a source region 8A and a drain region 8B are formed in the semiconductor substrate 1, respectively. A metal silicide layer 9 is formed on the exposed gate electrode 4 and semiconductor substrate 1, and an interlayer insulation layer 10 is formed on the resulting structure. After forming contact holes exposing the source region 8A and the drain region 8B using the photolithography and etching processes, a metal wiring 11 is formed on the source region 8A and the drain region 8B.

As stated above, since the source regions 8A, the drain region 8B and the channel region 12 are formed in the single crystalline silicon substrate by the ion implantation processes, the length of the gate electrode 4 must be short to increase the operating speed of the device. However, the short gate electrode may cause the breakdown voltage to be decreased because of the short distance between the source region 8A and the drain region 8B. Also, because the drain-induced barrier lowering and the punch-through are generated in the depletion layer between the source region 8A and the drain region 8B, it may be very difficult to implement a high performance transistor.

In other words, there exist the inevitable trade-off problem between high frequency and the high breakdown voltage. It is difficult to make the concentration of the channel region 12 uniform and then the uniformity of the threshold voltage is poor. Furthermore, because the source region 8A and the drain region 8B are formed in the single crystalline silicon substrate by the ion implantation processes, the maximum value of the impurity concentration in the source and drain regions 8A and 8B is low and then a parasite resistivity will become higher.

FIG. 2 is a cross sectional view illustrating a MOSFET in accordance with the second embodiment of the prior art.

A silicon-on-insulator (SOI) substrate 21 consists of a lower silicon layer 21A, an insulting layer 21B and an upper silicon layer 21C. An active region 22 and a field region 23 are defined by forming a field oxide layer and by implanting impurity ions into the upper silicon layer 21C two times. If the first impurity ions are N-type (or P-type) ions, the second impurity ions are P-type (or N-type) ions. That is, if the active region 22 has N-type (or P-type) ions, the field region 23 has P-type (or N-type) ions.

As shown in FIG. 2, the active region 22 is defined by forming the field oxide layer 23 by applying the thermal oxidation process to the semiconductor substrate 21, such as a silicon substrate. A channel region 24 is formed by implanting ions into the active region so as to adjust the threshold voltage. A gate electrode 26 is formed on the channel region 24 and a gate oxide layer is formed between the gate electrode 26 and the channel region 24. The low concentration ion implantation process is carried out so that lightly doped regions 27 are formed on the sidewalls of the gate electrode 26. Also, after forming the spacer oxide layer 28 on the both sidewalls of the gate electrode 26, a highly doped region 29 is formed in the active region 22 and both sides of the gate electrode, using the high concentration ion implantation process. Accordingly, the LDD structures, which includes the lightly and highly doped regions 27 and 29, are formed both sides of the gate electrode 26, respectively. For example, a source region 30A and a drain region 30B are formed in the active region 22, respectively. A metal silicide layer 31 is formed on the exposed gate electrode 26 and the upper silicon layer 21c and an interlayer insulation layer 32 is formed on the resulting structure. After forming a contact hole exposing the source region 30A and the drain region 30B using the photolithography and etching processes, a metal wiring 33 is formed on the source region 30A and the drain region 30B.

As stated in the second embodiment, since the source regions 30A, the drain region 30B and the channel region 24 are formed in the upper silicon layer 21c of the single crystalline by the ion implantation processes, the length of the gate electrode 26 must be short to increase the operating speed of the device. However, the short gate electrode may cause the breakdown voltage to be decreased because of the short distance between the source region 30A and the drain region 30B. Also, because the drain-induced barrier lowering and the punch-through are generated in the depletion layer between the source region 30A and the drain region 30B, it may be very difficult to implement a high performance transistor.

In other words, there exist the inevitable trade-off problem between high frequency and the high breakdown voltage. It is difficult to make the concentration of the channel region 24 uniform and then the uniformity of the threshold voltage is poor. Furthermore, because the source region 30A and the drain region 30B are formed in the single crystalline silicon substrate by the ion implantation processes, the maximum value of the impurity concentration in the source and drain regions 30A and 30B is low and then a parasite resistivity is high.

SUMMARY OF THE INVENTION

An object of the present invention is to provide a MOSFET capable of effectively adjusting threshold voltage, improving the uniformity of threshold voltage, and preventing the electric characteristics of the device, such as the breakdown voltage, the punch-through effect and the drain-induced barrier lowering (DIBL), from being deteriorated by isolating source/drain regions by using a Si or SiGe channel and to provide a method for fabricating the same.

In accordance with an aspect of the present invention, there is provided a field effect transistor comprising: a field oxide layer formed in a semiconductor substrate, exposing a device region of the semiconductor substrate; a first insulation layer formed on the semiconductor substrate, exposing an active region of the semiconductor substrate; a conducting layer for source/drain regions formed on the first insulation layer, exposing the active region; a first spacer insulation layer formed on sidewalls of the conducting layers; a semiconductor layer formed on the exposed active region of the semiconductor substrate; channel layer formed on the resulting structure, wherein the channel layer formed on the conducting layer for the source/drain regions and the first spacer insulation layer is a polycrystalline layer and the channel layer formed on the semiconductor layer is a single crystalline layer; a gate insulation layer formed on the single crystalline channel layer; a gate electrode formed on the gate insulation layer; and a second spacer insulation layer formed on both sidewalls of the gate electrode.

In accordance with another aspect of the present invention, there is provided a method for forming a field effect transistor comprising the steps of: forming a field oxide layer in a field region of a semiconductor substrate and forming a first insulation layer, a first conducting layer for source/drain regions and a second insulation layer, in order; defining an active region by patterning, in order, the second insulation layer and the first conducting layer for the source/drain regions, exposing a portion of the first insulation layer; forming a first spacer insulation layer on sidewalls of the exposed conducting layer and forming a second spacer insulation layer on sidewalls of the first spacer insulation layer and the second insulation layer;

removing the first insulation layer to be exposed, exposing a portion of the semiconductor substrate; selectively forming a semiconductor layer on the exposed semiconductor substrate; planarizing the semiconductor layer using a chemical-mechanical polishing; forming a thermal oxide layer on the semiconductor layer using a thermal oxidation process;

exposing the first conducting layer and the semiconductor layer by etching the second insulation layer, a portion of the second spacer insulation layer and the thermal oxide layer; forming a channel layer, a gate insulation layer and a second conducting layer, in order, on the resulting structure; forming a gate electrode by patterning the second conducting layer; and forming a third spacer insulation layer on sidewalls of the gate electrode.

BRIEF DESCRIPTION OF THE DRAWING

The above and other objects, advantages and features of the present invention will be more apparent from the following detailed description taken with the attached drawings in which.

DETAILED DESCRIPTION OF THE PREFERRED EMBODIMENTS

Hereinafter, the present invention will be described in detail referring to accompanying drawings.

First, FIGS. 3A to 3F are cross sectional views illustrating a MOSFET in accordance with the present invention.

Figure 1:
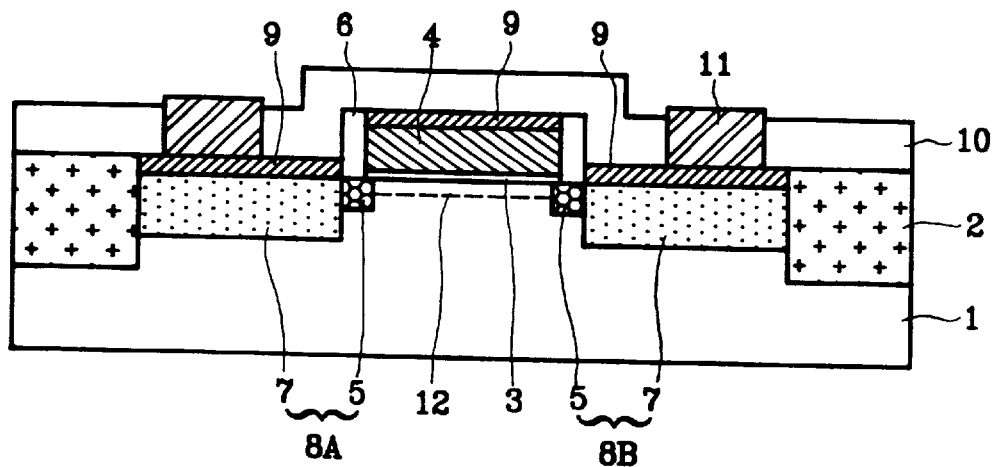
FIG. 1 is a cross sectional view illustrating a MOSFET in accordance with the first embodiment of a prior art.
Figure 2:
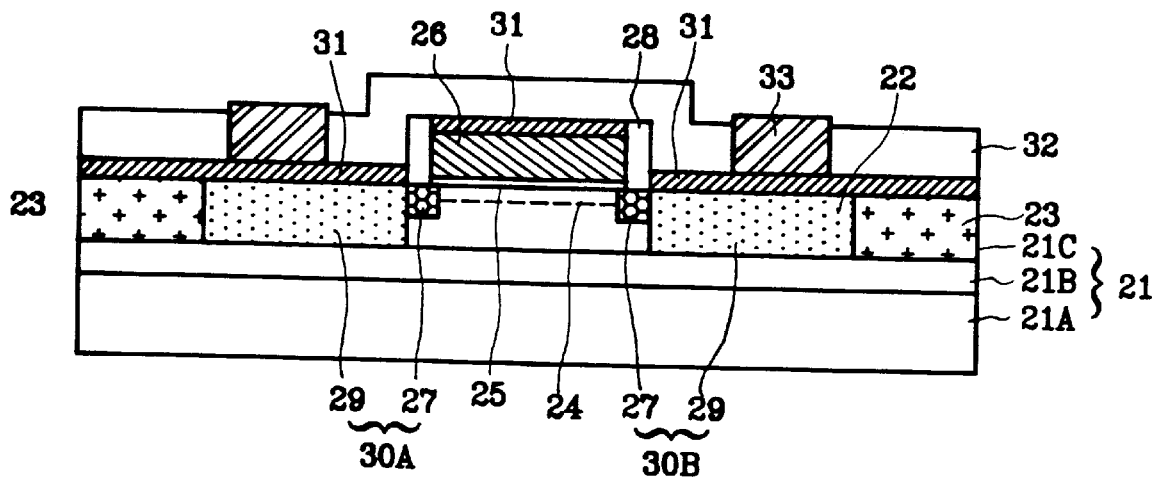
FIG. 2 is a cross sectional view illustrating a MOSFET in accordance with the second embodiment of the prior art.
Figure 3A:
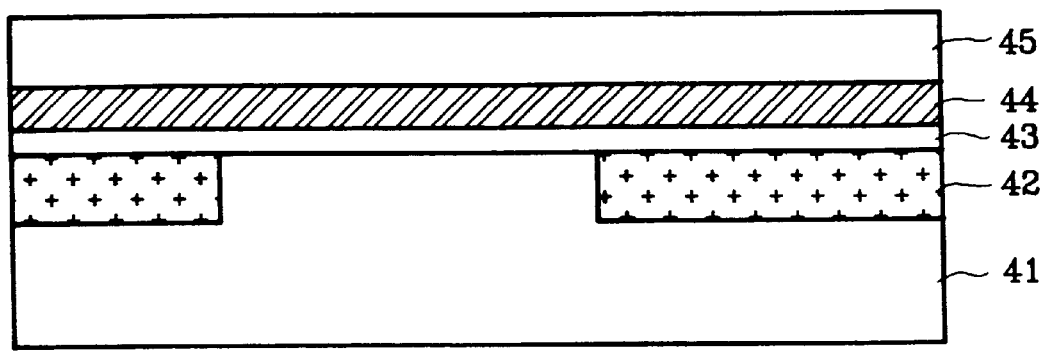
FIGS. 3A to 3F are cross sectional views illustrating a MOSFET in accordance with the present invention.

Referring to FIG. 3A, a field oxide layer 42 is formed in a semiconductor substrate 41. After forming the field oxide layer 42, a first insulation layer 43, a conducting layer 44 for source/drain regions and a second insulation layer 45 are, in order, formed on the resulting structure.

The first and second insulation layers 43 and 45 are made of oxide or nitride and the conducting layer 44 for the source/drain regions is made of any one of polycrystalline Si, polycrystalline SiGe or polycrystalline Ge. The concentration of the ions which are implanted into the source/drain regions is about $10^{21} cm^{-3}$.

Alternatively, the source/drain regions can be formed by the in-situ process.

Figure 3B:
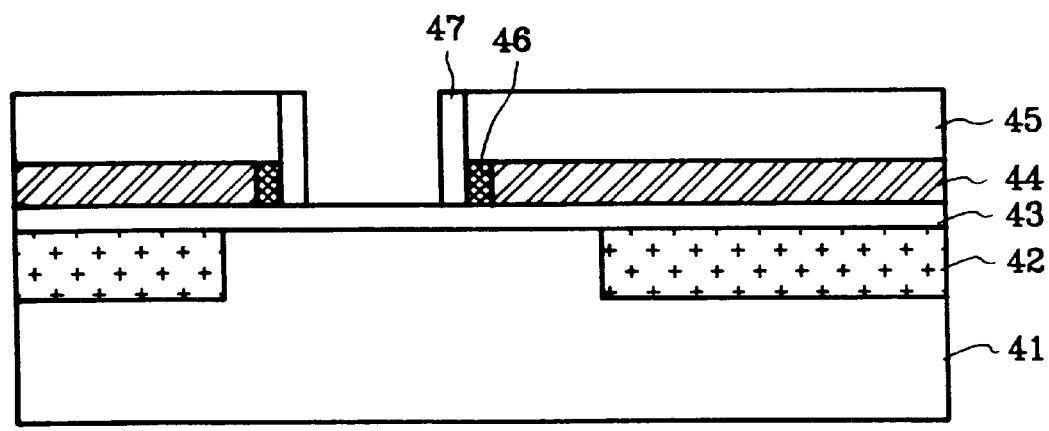

Referring to FIG. 3B, a portion of the second insulation layer 45 and the conducting layer 44 for the source/drain regions in an active region is removed by the dry etching process, exposing the sidewalls of the second insulation layer 45 and the conducting layer 44. A first spacer insulation layer 46 is formed on the sidewalls of the exposed conducting layer 44 and a second spacer insulation layer 47 is formed on the sidewalls of the exposed insulation layers 45 and 46. At this time, the first spacer insulation layer 46 is formed by applying the thermal oxidation process to the sidewalls of the exposed conducting layer 44.

Also, the second spacer insulation layer 47 is formed by depositing a nitride layer and applying the anisotropic process to the nitride layer.

Figure 3C:
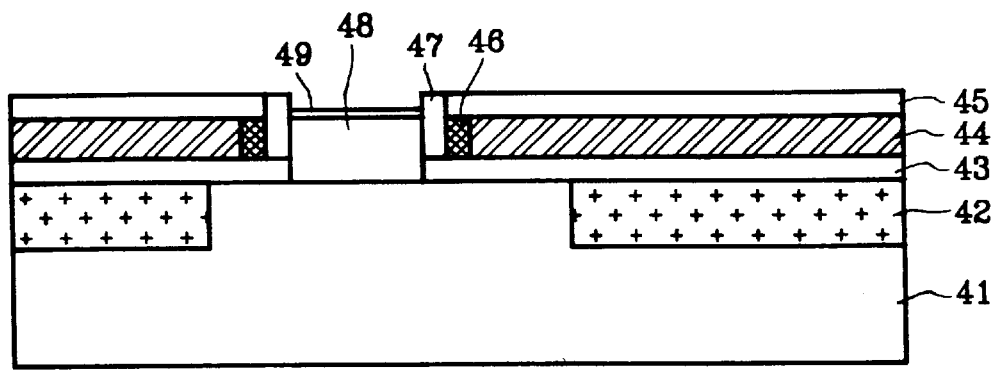

Referring to FIG. 3C, after removing the first insulation layer 43 exposed by etching the conducting layer 44, a semiconductor layer 48 grows in the active region and is planarized by a chemical-mechanical polishing and then the upper portion thereof is oxidized by the thermal oxidation process, thereby forming a thermal oxide layer 49. At this time, during the removal of the first insulation layer 43, the same thickness of the second insulation layer 45 and the second spacer insulation layer 47 as the thickness of the first insulation layer 43 are also etched. The semiconductor layer 48, which has been formed in the active region, is made of any one of single crystalline Si, single crystalline SiGe, single crystalline Ge, single crystalline Si/SiGe, and single crystalline Si/Ge layers into which impurity ions are introduced by the in-situ process or the ion implantation process. Alternatively, the semiconductor layer 48 may be made of single crystalline materials which don't contain impurities. The semiconductor layer 48 is formed at a thickness similar to that of conducting layer 44 for the source/drain regions.

Figure 3D:
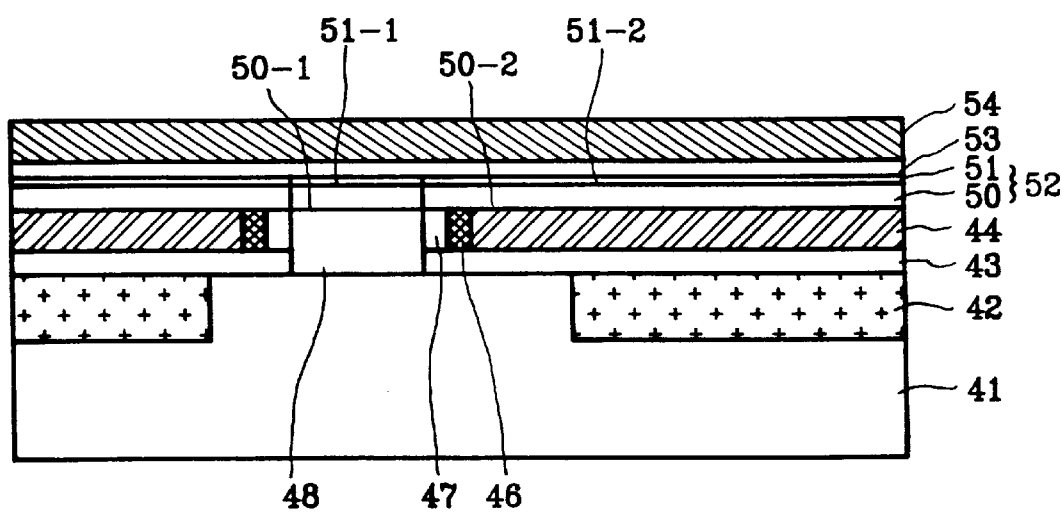

Referring to FIG. 3D, the second insulation layer 45, the second spacer insulation layer 47 and the thermal oxide layer 49 is etched until the conducting layer 44 for the source/drain regions is exposed, and a semiconductor layer 52 for a channel region, a gate oxide layer 53 and a conducting layer 54 for a gate electrode are, in order, formed on the resulting structure.

At this time, the conducting layer for the channel region may be a single layer or a double layer. In the case of the single layer, a SiGe layer or a Ge layer may be deposited as the semiconductor layer 52 for the channel region. In the case of the double layer, any one of a Si layer, a SiGe layer or a Ge layer may be deposited as the second layer thereof. When the semiconductor layer 52 for the channel is formed, single crystalline semiconductor layers 50-1 and 51-1 must be formed on the semiconductor layer 48, and polycrystalline semiconductor layers 50-2 and 51-2 must be formed on the first and second spacer insulation layers 46 and 47 and the conducting layer 44 for the source/drain regions.

Also, the conducting layer 54 for the gate electrode is made of one of a polycrystalline Si layer, a polycrystalline SiGe layer and a polycrystalline Ge layer into which impurities are introduced in the in-situ process or the ion implantation process.

Figure 3E:
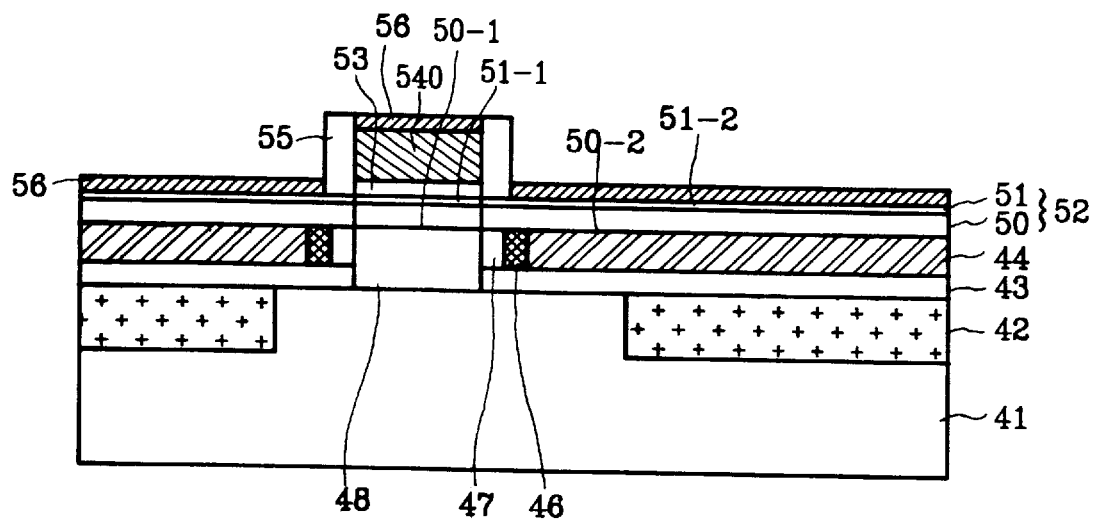

Referring to FIG. 3E, a gate electrode 540 is formed by patterning the conducting layer 54 using a mask to define a gate electrode. Third spacer insulation layers 55 are formed on both sidewalls of the gate electrode 540 and metal silicide layers 56 are formed on the exposed gate electrode 540 and the exposed semiconductor layer 52. At this time, the third spacer insulation layer 55 is formed by depositing and anisotropically etching a nitride layer or an oxide layer.

Figure 3F:
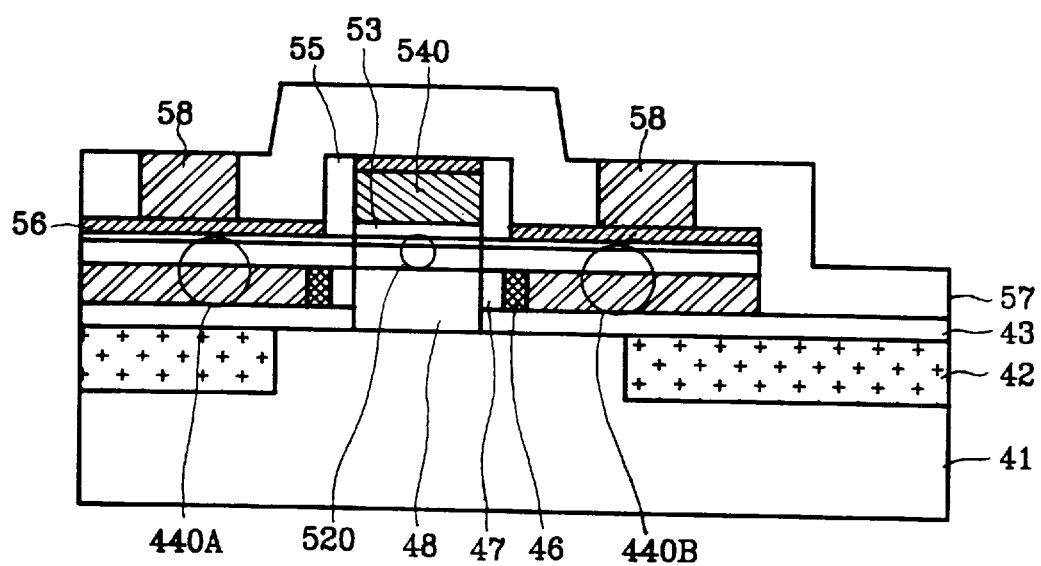

Referring to FIG. 3F, the metal silicide layer 56, the conducting layer 52 for the channel region and the conducting layer 44 for the source/drain regions are, in order, patterned and an interlayer insulation layer 57 is formed on the resulting structure. Finally, after forming contact holes exposing portions of the source region 440A and the drain region 440B, a metal wiring 58 is formed, being in contact with the source region 440A and the drain region 440B. At this time, the source/drain regions 440A and 440B are made of the conducting layers 50-2 and 51-2 in the conducting layer 44 and the semiconductor layer 52 and the channel region 520 are made of the conducting layers 50-1 and 51-1 in the semiconductor layer 52.

As stated above, the transistor according to the present invention can solve the problems, such as the punch-through caused by the short distance between the source region 440A and the drain region 440B, the decrease of the breakdown voltage between the source region 440A and the drain region 440B and the leakage current flowing into the bulk region beneath the channel due to the drain-induced barrier lowering. Furthermore, because the source region 440A and the drain region 440B are isolated from the semiconductor substrate 41 by the first insulation layer 43, the removal of the parasite junction capacitor speeds up the transistor.

In particular, since the multilayer 52 of the single crystalline Si/SiGe 50-1 and 51-1 is formed on the single crystalline silicon layer 48 when the Si/SiGe multilayer 52 is formed in the channel region, the polycrystalline Si/Ge multilayer (50-2 and 51-2) is formed on the source/drain polycrystalline layer 44 and the spacer insulation layers 46 and 47, and the source/drain regions are defined by the impurities diffused into the multilayer (50-2 and 51-2) from the polycrystalline layer 44 having a high impurity concentration of about $10^{21} cm^{-3}$ through the in-situ process. The MOSFET according to the present invention decreases the source/drain junction parasite capacitance, thereby increasing the operating speed of the device. Also, because the present invention forms the thin film in the channel region using the in-situ process, the concentration of the channel region is uniform so that the threshold voltage and the process reliability of the device may be improved.

In addition, since the SiGe layer having the energy band gap lower than the silicon layer is used, the potential well, which is formed on the valence band in the energy band of the channel region made of the Si/Ge layers, limits the holes to therein and then the mobility of the holes moving from the source region to the drain region through the potential well may increase up to two times because the mobility of the holes in the SiGe layer is twice as fast as that in the silicon layer. Accordingly, as compared with the conventional device using the silicon channel without the potential well, the operating speed of the device according to the present invention may increase.

The narrower the energy band gap of the SiGe layer is, according to the amount of germanium, the deeper the potential well is. Therefore, the operating speed and the threshold voltage of the device can be controlled by the germanium content because the degree of restriction, which confines the hole only in the potential well, increases.

As apparent from the above, the present invention effectively adjusts threshold voltage, improves the uniformity of threshold voltage, prevents the electric characteristics of the device, such as the breakdown voltage, the punch-through effect and the drain-induced barrier lowering (DIBL), from being deteriorated by isolating source/drain regions.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a field effect transistor comprising the steps of:

forming a field oxide layer in a field region of a semiconductor substrate and forming a first insulation layer, a first conducting layer for source/drain regions and a second insulation layer, in order;

defining an active region by patterning, in order, the second insulation layer and the first conducting layer for the source/drain regions, exposing a portion of the first insulation layer;

forming a first spacer insulation layer on sidewalls of the exposed conducting layer and forming a second spacer insulation layer on sidewalls of the first spacer insulation layer and the second insulation layer;

removing the first insulation layer to be exposed, exposing a portion of the semiconductor substrate;

selectively forming a semiconductor layer on the exposed semiconductor substrate;

planarizing the semiconductor layer using a chemical-mechanical polishing;

forming a thermal oxide layer on the semiconductor layer using a thermal oxidation process;

exposing the first conducting layer and the semiconductor layer by etching the second insulation layer, a portion of the second spacer insulation layer and the thermal oxide layer;

forming a channel layer, a gate insulation layer and a second conducting layer, in order, on the resulting structure;

forming a gate electrode by patterning the second conducting layer; and forming a third spacer insulation layer on sidewalls of the gate electrode.

2. The method in accordance with claim 1, wherein the channel layer on the first conducting layer for the source/drain regions and the first and second spacer insulation layers is a polycrystalline layer and wherein the channel layer on the semiconductor layer is a single crystalline layer.

3. The method in accordance with claim 2, after forming the third spacer insulation layer, wherein the method further comprises the steps of:
   selectively forming a metallic silicide layer on the channel layer and the gate electrode;
   forming the source/drain regions by selectively etching the silicide layer, the channel layer and the first conducting layer, in order;
   forming an interlayer insulation layer on the resulting structure and forming contact holes exposing portions of the silicide layer; and
   forming a metal wiring being in contact with the exposed silicide layer.

4. The method in accordance with claim 1, wherein the first conducting layer for source/drain regions is any one of a polycrystalline Si layer, a polycrystalline SiGe layer and a polycrystalline Ge layer which contain impurities.

5. The method in accordance with claim 1, wherein the semiconductor layer is any one of a single crystalline Si layer, a single crystalline SiGe layer, a single crystalline Ge layer, a single crystalline Si/SiGe layer and a single crystalline Si/Ge layer.

6. The method in accordance with claim 5, wherein the single crystalline Si layer, the single crystalline SiGe layer, the single crystalline Ge layer, the single crystalline Si/SiGe layer and the single crystalline Si/Ge layer contain impurities.

7. The method in accordance with claim 1, wherein the channel layer is any one of a Si, SiGe, Ge, Si/SiGe and Si/Ge layers.

8. The method in accordance with claim 1, wherein the gate electrode is any one of a polycrystalline Si layer, a polycrystalline SiGe layer and a polycrystalline Ge layer which contain impurities.

9. The method in accordance with claim 1, wherein the first and second insulation layers are any one of an oxide layer and a nitride layer.

10. The method in accordance with claim 1, wherein the first spacer insulation layer is formed by applying a thermal oxidation process to sidewalls of the exposed conducting layer.

11. The method in accordance with claim 1, wherein the step of forming the second spacer insulation layer on sidewalls of the first spacer insulation layer and the second insulation layer comprises the steps of:
    forming a nitride layer on the resulting structure; and
    applying an anisotropic etching process to the nitride layer.

12. The method in accordance with claim 1, wherein the step of forming the third spacer insulation layer on sidewalls of the gate electrode comprises the steps of:
    forming a nitride layer on the resulting structure; and
    applying an anisotropic etching process to the nitride layer.

* * * * *